United States Patent
Chi et al.

(10) Patent No.: US 10,310,580 B2
(45) Date of Patent: Jun. 4, 2019

(54) VOLTAGE LEVEL DETECTION AND ANALOG CIRCUIT ARRANGEMENTS FOR MEMORY SYSTEMS

(71) Applicant: SanDisk Technologies Inc., Plano, TX (US)

(72) Inventors: Steve Xiaofeng Chi, Cupertino, CA (US); Ekram Hossain Bhuiyan, San Jose, CA (US)

(73) Assignee: SanDisk Technologies LLC, Plano, TX (US)

( * ) Notice: Subject to any disclaimer, the term of this patent is extended or adjusted under 35 U.S.C. 154(b) by 152 days.

(21) Appl. No.: 14/879,627

(22) Filed: Oct. 9, 2015

(65) Prior Publication Data

US 2017/0102754 A1  Apr. 13, 2017

(51) Int. Cl.

| G06F 1/10 | (2006.01) |
|---|---|
| G06F 1/28 | (2006.01) |
| G11C 5/14 | (2006.01) |
| G11C 16/30 | (2006.01) |

(52) U.S. Cl.
CPC ............... G06F 1/28 (2013.01); G06F 1/10 (2013.01); G11C 5/147 (2013.01); G11C 16/30 (2013.01)

(58) Field of Classification Search
CPC ..................................... G06F 1/28; G06F 1/10
See application file for complete search history.

(56) References Cited

U.S. PATENT DOCUMENTS

| 6,226,756 | B1* | 5/2001 | Mueller | G06F 1/04 |
| | | | | 713/500 |
| 6,748,545 | B1* | 6/2004 | Helms | G06F 1/26 |
| | | | | 713/300 |
| 2005/0024128 | A1* | 2/2005 | Pasternak | G06F 1/305 |
| | | | | 327/541 |
| 2005/0152202 | A1 | 7/2005 | Choi et al. | |
| 2007/0183225 | A1* | 8/2007 | Barth | G11C 11/4074 |
| | | | | 365/189.09 |
| 2008/0231349 | A1* | 9/2008 | Naitou | G06F 1/26 |
| | | | | 327/538 |
| 2009/0230934 | A1* | 9/2009 | Hooijschuur | H02M 3/1582 |
| | | | | 323/282 |
| 2011/0095814 | A1 | 4/2011 | Kim et al. | |

(Continued)

OTHER PUBLICATIONS

Invitation to Pay Additional Fees and Where Applicable Protest Fee and Annex to Form PCT/ISA/206—Communication Relating to the Results of the Partial International Search for corresponding application PCT/US2016/051835 dated Dec. 22, 2016.

*Primary Examiner* — Kim Huynh
*Assistant Examiner* — Kevin M Stewart
(74) *Attorney, Agent, or Firm* — Brinks Gilson & Lione

(57) ABSTRACT

An apparatus may include detection circuitry configured to detect a presence of a host clock signal on a host clock line, and detect a level of a host supply voltage upon detection of the host clock signal. The detection circuitry may configure a core regulator in a regulation mode or in a bypass mode based on the detected level of the host supply voltage. Additionally, components of analog circuitry of a nonvolatile memory system may be partitioned into different supply voltage domains, with those components active during a sleep state receiving one supply voltage and those components inactive during the sleep state receiving a different supply voltage.

15 Claims, 6 Drawing Sheets

(56) References Cited

U.S. PATENT DOCUMENTS

| | | | |
|---|---|---|---|
| 2013/0021077 A1* | 1/2013 | Mathur | H03K 5/19 |
| | | | 327/205 |
| 2013/0033941 A1 | 2/2013 | Kim et al. | |
| 2013/0073839 A1 | 3/2013 | Hasegawa | |
| 2013/0321071 A1 | 12/2013 | Pietri et al. | |
| 2014/0003184 A1* | 1/2014 | Quach | G11C 7/1057 |
| | | | 365/230.08 |
| 2015/0188421 A1* | 7/2015 | Ko | H02M 3/156 |
| | | | 323/282 |

* cited by examiner

VOLTAGE LEVEL DETECTION AND ANALOG CIRCUIT ARRANGEMENTS FOR MEMORY SYSTEMS

BACKGROUND

An embedded non-volatile memory system may receive a first supply voltage VCC and a second supply voltage VCCQ from a host. Different hosts may supply the second supply voltage VCCQ at different levels. For example, some hosts may supply the second supply voltage at 3.3 Volts or 1.8 Volts, while other hosts may supply the second supply voltage at 1.2 Volts. In order to be compatible with different hosts and the possible different levels at which a host may supply the second supply voltage VCCQ, embedded non-volatile memory systems have been configured with hard-wired configurations pins and/or different substrate designs, which are costly and difficult to manage logistically. A less costly detection mechanism that can detect various levels of the second supply voltage VCCQ and that does not require additional configuration pins or different substrate designs may be desirable.

In addition, embedded non-volatile memory systems may include analog circuitry configured to deliver power and clock signals to a core, as well as perform other functions. The analog circuitry may receive a supply voltage from a host system with which it communicates. Current configurations of the analog circuitry may be robust (i.e., their exposure to inherent noisiness of the supply voltage is minimal) as well as compatible with current levels of the supply voltage. However, due to changes in host technology, some host systems may supply the supply voltage at levels lower than the current levels. Current analog circuitry configurations may not be compatible with these lower supply voltage levels. An analog circuitry configuration that is compatible with different levels at which different hosts may supply the supply voltage to the analog circuitry may be desirable.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

DETAILED DESCRIPTION OF PRESENTLY PREFERRED EMBODIMENTS

Overview

Figure 1:
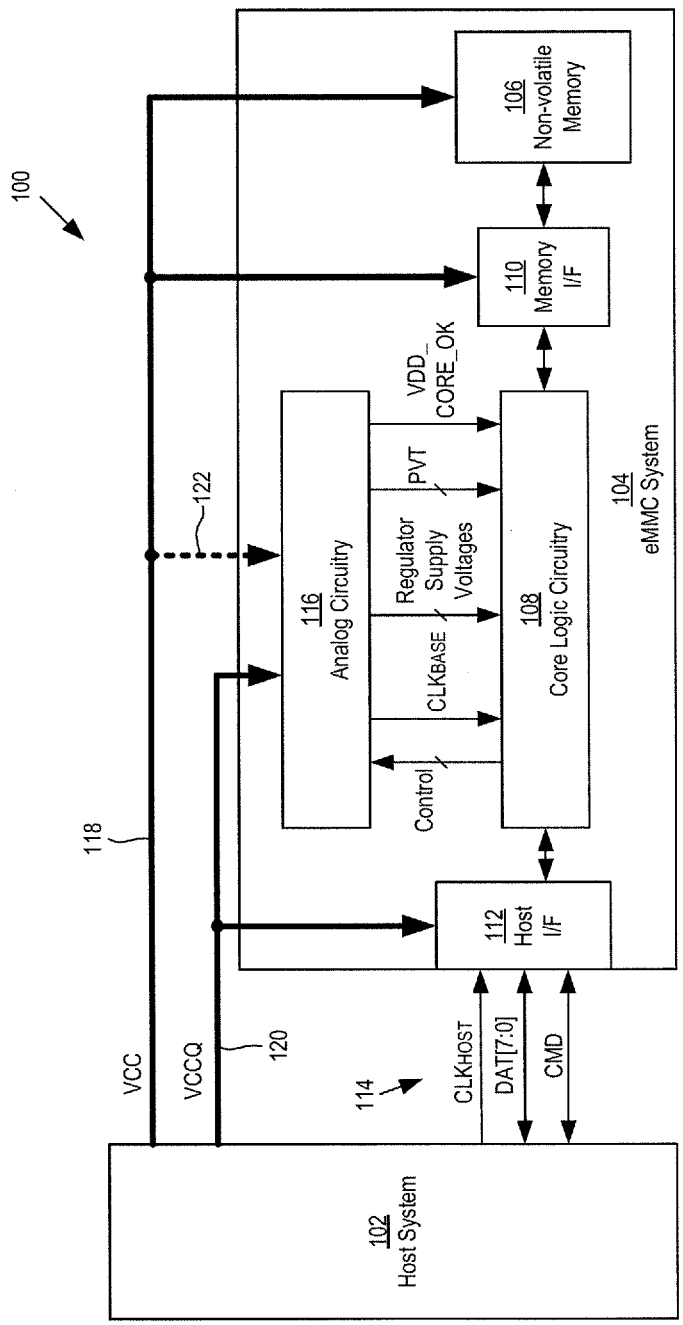
FIG. 1 is a block diagram of an example electronic system that includes a host system and an embedded multi-media card (eMMC) system of an apparatus.

The following embodiments describe memory systems, devices, and related methods for using a host clock signal to configure a core regulator in a desired mode of operation. The following embodiments also describe memory systems, devices, and related methods for analog circuitry arrangements that include multiple supply voltage domains in which circuit components of analog circuitry of the eMMC systems may be configured.

In a first embodiment, an apparatus may include core logic circuitry, host clock detection circuitry, and a core regulator. The host clock detection circuitry may be configured to detect a host clock signal. The core regulator may be configured to receive a supply voltage, and supply a core supply voltage based on the supply voltage to the core logic circuitry. The core regulator may be configured to supply the core supply voltage as a regulated voltage or an unregulated voltage based on the detection of the host clock signal.

In a second embodiment, a method may include: receiving, with a core regulator, a host supply voltage from a host system; detecting, with host clock detection circuitry, a presence of a host clock signal on a host clock line; and supplying, with the core regulator, a core supply voltage as a regulated voltage or an unregulated voltage to core logic circuitry based on detecting the presence of the host clock signal.

In some example embodiments, the host clock detection circuitry may send a notification to host supply voltage level detection circuitry in response to the detection of the host clock signal. The host supply voltage level detection circuitry may detect the level of the supply voltage in response to receipt of the notification, and configure the core regulator to supply the core supply voltage as either the regulated voltage or the unregulated voltage based on the detected level of the supply voltage.

In some example embodiments, host supply voltage level detection circuitry may generate a control signal that configures the core regulator to supply the core supply voltage as the regulated voltage, and send the control signal to the core regulator.

In some example embodiments, host interface circuitry may receive the host clock signal on a host clock line during a predetermined time period, and receive a synchronization command upon expiration of the predetermined time period. The host clock detection circuitry may detect the host clock signal on the host clock line within the predetermined time period.

In some example embodiments, power on detection circuitry may send a notification to the core logic circuitry based on the detection of the host clock signal, which may indicate that the level of the supply voltage is stable.

In some example embodiments, when the detected level of the supply voltage corresponds to a first predetermined voltage level, host supply voltage level detection circuitry may generate and output a core regulator control signal so that the core regulator is configured to output the core supply voltage as the regulated voltage, and when the detected level of the supply voltage corresponds to a second predetermined voltage level, the host supply voltage level detection circuitry may generate and output the core regulator control signal so that the core regulator is configured to output the core supply voltage as the unregulated voltage.

In some embodiments, an output of the core regulator is in a floating or high impedance state prior to being configured to supply the core supply voltage as the regulated voltage or the unregulated voltage.

In some embodiments, at least one second regulator may be configured to supply at least one second supply voltage to at least one of: delay locked loop circuitry, phase locked loop circuitry, or a physical layer interface of the core logic circuitry. The at least one second regulator may be configured to supply the at least one second supply voltage as either a regulated voltage or an unregulated voltage to the core logic circuitry based on the detection of the host clock signal.

In a third embodiment, an apparatus may include core logic circuitry and analog circuitry. The analog circuitry may include: first voltage domain circuitry configured to receive a first host supply voltage from a host system in both a first power mode and a second power mode. The first voltage domain circuitry may include first regulator circuitry configured to supply a first regulator supply voltage to the core logic circuitry. The analog circuitry may also include second voltage domain circuitry configured to receive a second host supply voltage from the host system in the second power mode but not in the first power mode. The second voltage domain circuitry may include at least one of: second regulator circuitry configured to supply at least one second regulator supply voltage to the core logic circuitry or clock generation circuitry configured to supply a clock signal to the core logic circuitry.

In some example embodiments, the second regulator circuitry may be configured to supply the at least one second regulator supply voltage to at least one of: delay locked loop circuitry, phase locked loop circuitry, or a physical layer interface of the core logic circuitry. The first voltage domain circuitry may further include: bandgap generator circuitry configured to generate a reference voltage based on the first host supply voltage, and supply the reference voltage to the first regulator circuitry. The first regulator circuitry may be configured to generate the first regulator supply voltage based on receipt of both the first host supply voltage and the reference voltage. The first voltage domain circuitry may also include charge pump circuitry, and pre-regulator circuitry. The charge pump circuitry may be configured to generate a charge pump voltage based on the first host supply voltage, and supply the charge pump voltage to the pre-regulator circuit. The pre-regulator circuit may be configured to generate a pre-regulator voltage based on the charge pump voltage, and supply the pre-regulator voltage to the bandgap generator circuitry.

In some example embodiments, processing circuitry of the core logic circuitry may be configured to detect that the analog circuitry is to switch from the first power mode to the second power mode, and in response to the detection, disable the second voltage domain circuitry while keeping the first voltage domain circuitry enabled.

In some example embodiments, the second voltage domain circuitry may include at least one of analog testing circuitry or process-voltage-temperature sensor circuitry.

In some example embodiments, the non-volatile memory system may be an embedded multi-media card.

Other embodiments are possible, and each of the embodiments can be used alone or together in combination. Accordingly, various embodiments will now be described with reference to the attached drawings.

Exemplary Embodiments

As mentioned in the background section above, some host systems may supply an embedded multi-media card (eMMC) system with a supply voltage VCCQ at 3.3 V or 1.8 V, while other host systems may supply the eMMC system with the supply voltage VCCQ at a lower voltage, such as 1.2 V. The following embodiments describe memory systems, devices, and related methods for using a host clock signal to determine when to detect a level of the supply voltage VCCQ in order to configure a core regulator in a desired mode of operation. The following embodiments also describe systems, devices, apparatuses, and related methods for analog circuitry arrangements that include multiple supply voltage domains in which circuit components of analog circuitry of the eMMC systems may be configured.

FIG. 1 is block diagram of an electronic system 100 that includes a host system 102 and an embedded multi-media card (eMMC) system 104. The eMMC system 104 may be any memory device or storage module that is configured to operate in accordance with an eMMC standard or specification, such as a JEDEC Solid State Technology Association Embedded Multi-Media Card Electrical Standard (hereafter referred to as the "JEDEC eMMC Standard"). The host system 102 may be any electronic system or device that is configured to communicate and/or operate with the eMMC system 104.

As shown in FIG. 1, the eMMC system 104 may include non-volatile memory 106, which may include a plurality of non-volatile memory elements or cells, each configured to store one or more bits of data. The non-volatile memory elements or cells may be any suitable non-volatile memory cells, such as NAND flash memory cells and/or NOR flash memory cells in a two dimensional and/or three dimensional configuration. The memory cells may take the form of solid-state (e.g., flash) memory cells and can be one-time programmable, few-time programmable, or many-time programmable.

The eMMC system 104 may also include core logic circuitry 108 that performs memory management functions for the storage of data in the non-volatile memory 106. Example memory management functions may include, but not limited to, communicating with the host system 102, including receiving, handling, and responding to host requests or commands, such as read, write, erase, and status requests/commands received from the host system 102; formatting the non-volatile memory 106 to ensure it is operating properly; mapping out bad memory cells; allocating spare cells to be substituted for future failed cells; and transitioning the eMMC system 104 between different states, operation modes, and/or power consumption modes. In operation, when the host system 102 needs to read data from or write data to the non-volatile memory 106, it may communicate with the core logic circuitry 108. If the host system 102 provides a logical address to which data is to be read/written, the core logic circuitry 108 may convert the logical address received from the host system 102 to a physical address in the non-volatile memory 106. Other memory management functions may include, but are not limited to, wear leveling (distributing writes to avoid wearing out specific blocks of memory that would otherwise be repeatedly written to) and garbage collection (after a block is full, moving only the valid pages of data to a new block, so the full block can be erased and reused).

In addition, the eMMC system 104 may include a memory interface (I/F) 110 that provides an interface between the core logic circuitry 108 and the non-volatile memory 106.

The core logic circuitry 108 may be configured to communicate data and commands with the non-volatile memory 106 via the memory interface 110 to store data in and/or read data from the non-volatile memory 106. The eMMC system 104 may also include a host interface 112 to communicate with the host system 102. The host interface 112 may be coupled to a communications bus 114 on which the interface 112 sends and receives signals to and from the host system 102. The host interface 112 may include driver circuitry configured to generate the signals, such as by pulling up to a high level and pulling down to a low level voltages on the lines of the communications bus 114.

The communications bus 114 may include a host clock line $CLK_{HOST}$ on which the host system 102 may send a host clock signal to the eMMC system 104; data lines DAT[7:0] (i.e., eight data lines DAT0 to DAT7) on which the host system 102 and the eMMC system 104 may communicate data signals with each other; and a command line CMD on which the host system 102 and the eMMC system 104 may communicate command signals and responses with each other. The data signals may include data that the host system 102 wants stored in or read from the eMMC system 104. Command signals sent from the host system 102 may instruct or request that the eMMC system 104 perform some action, such as perform an operation, transition into a certain state, or respond with requested information, as examples. The response signals sent from the eMMC system 104 may acknowledge receipt of the command signals, indicate that the instructed/action is performed, or include the requested information, as examples. The host clock signal may set the frequency of the communications bus 114 and/or control the data flow by providing the times and/or rates at which the clock and data signals may be sampled by the eMMC system 104.

The eMMC system 104 may also include analog circuitry 116 that provides a plurality of regulator supply voltages to the core logic circuitry 108, including a core supply voltage. In addition, the analog circuitry 116 circuitry may provide a base clock signal $CLK_{BASE}$, one or more process-voltage-temperature (PVT) signals, and a core voltage stabilization signal VDD_CORE_OK indicating whether the core supply voltage is at a stable level. The core logic circuitry 108 may send one or more control signals to the analog circuitry 116 to configure, program, enable, and/or disable various components of the analog circuitry 116. Further details of the analog circuitry 116 are described below.

According to the JEDEC eMMC Standard, the eMMC system 104 may be configured to operate in a plurality of different operation modes, and in each mode, be configured in one or more states. The operation modes may include a device identification mode during which the host system 102 may reset the eMMC system 104, validate an operation voltage range and access mode with the eMMC system 104, and identify the eMMC system 104 and assign a Relative Device Address (RCA) to the eMMC system 104. In addition, the operation modes may include a data transfer mode in which the eMMC system is ready to handle host commands associated with the transfer of data, such as host read and write commands, and/or perform data storage and/or transfer operations. In some eMMC configurations, the eMMC system 104 may be also configured to operate in a boot mode, during which the host system 102 may read certain boot data from the eMMC system 104. Other operation modes may be possible, and in general, the eMMC system 104 may be initialized in the device identification mode and/or in the boot mode before it enters into the data transfer mode.

Before the eMMC system 104 enters into the operation modes, the eMMC system 104 may perform an initial power up process (or power cycle) with the host system 102. During the power up process, the host system 102 may begin supplying a plurality of supply voltages to the eMMC system 104 for the components of the eMMC system 104 to operate. The plurality of supply voltages may include a first supply voltage VCC supplied on a first supply line 118 and a second supply voltage VCCQ supplied on a second supply line 120. As shown in FIG. 1, the first supply voltage VCC may be sent to the non-volatile memory 106 and the memory interface 110. In addition, for some example configurations of the eMMC system 104, as described in further detail below and denoted by dotted arrow 122, the first supply voltage VCC may also be supplied to the analog circuitry 116. Additionally, the second supply voltage VCCQ may be sent to the host interface 112 and to the analog circuitry 116.

The host system 102 may be configured to supply each of the first supply voltage VCC and the second supply voltage VCCQ at levels corresponding to one of a plurality of predetermined voltage levels. Example predetermined voltage levels may include 3.3 Volts (V), 1.8 V, 1.2 V, although other predetermined voltage levels may be possible. In addition, each of the predetermined voltage levels may be associated with and/or be within an associated voltage range having a predetermined minimum level and a predetermined maximum level. Depending on the configuration of the host system 102, different host systems 102 may supply at least the second supply voltage VCCQ at different levels. To illustrate, some example host systems 102 may supply the second supply voltage VCCQ at a level corresponding to the 3.3 V level of the 1.8 V level while other example host systems 102 may supply the second supply voltage VCCQ at a level corresponding to a lower predetermined voltage level, such as 1.2 V.

As described in further detail below, a core regulator of the analog circuitry 116 may receive and be powered by the second supply voltage VCCQ. Upon receipt of the second supply voltage VCCQ, the core regulator may generate the core supply voltage and supply the core supply voltage to the core logic circuitry. The core supply voltage may be a regulated voltage in that the core regulator may be configured to maintain the core supply voltage at a target voltage level and/or within a target voltage range. The core regulator may include an operational amplifier (op-amp) or other similar circuitry to generate and regulate the core supply voltage. Such regulator circuitry may require a sufficiently large voltage drop or difference between the level of the second supply voltage VCCQ being input to the core regulator and the target level of the core supply voltage being output in order for the regulator circuitry to operate properly or as desired. As such, if the level of the second supply voltage VCCQ is sufficiently greater than the target level of the core supply voltage, then a voltage drop or difference between the input and output of the core regulator may be sufficiently large enough for the core regulator to function or operate properly. In this situation, when the voltage drop is sufficiently large, the core regulator may be configured to operate normally to generate a regulated core supply voltage. Alternatively, if the level of the second supply voltage VCCQ is sufficiently close to the target level of the core supply voltage such that the voltage drop or difference between the input and output of the core regulator is too small for the core regulator to function or operate properly, the second supply voltage VCCQ that is supplied to the core regulator's input may be bypassed directly to the core regulator's output without the core regulator performing any regulation. That is, the core regulator may output its core supply voltage as an unregulated voltage.

In order for the core regulator to be capable of handling different levels at which different host systems 102 may supply the second supply voltage VCCQ to the eMMC system 104, the core regulator may be configurable in both a regulation mode and a bypass mode. In the regulation mode, the core regulator may be configured to output a regulated voltage. In the bypass mode, the core regulator may be configured to output an unregulated voltage. As described in further detail below, the analog circuitry 116 may be configured to detect the level of the second supply voltage VCCQ in order to determine whether to configure the core regulator in the regulation mode or the bypass mode. The analog circuitry 116 may further be configured to determine when to detect the level based on detection of presence of the host clock signal being communicated on the host clock line $CLK_{HOST}$ of the communications bus 114. The analog circuitry 116 may further use detection of the host clock signal to send the core voltage stabilization signal VDD_CORE_OK.

Figure 2:
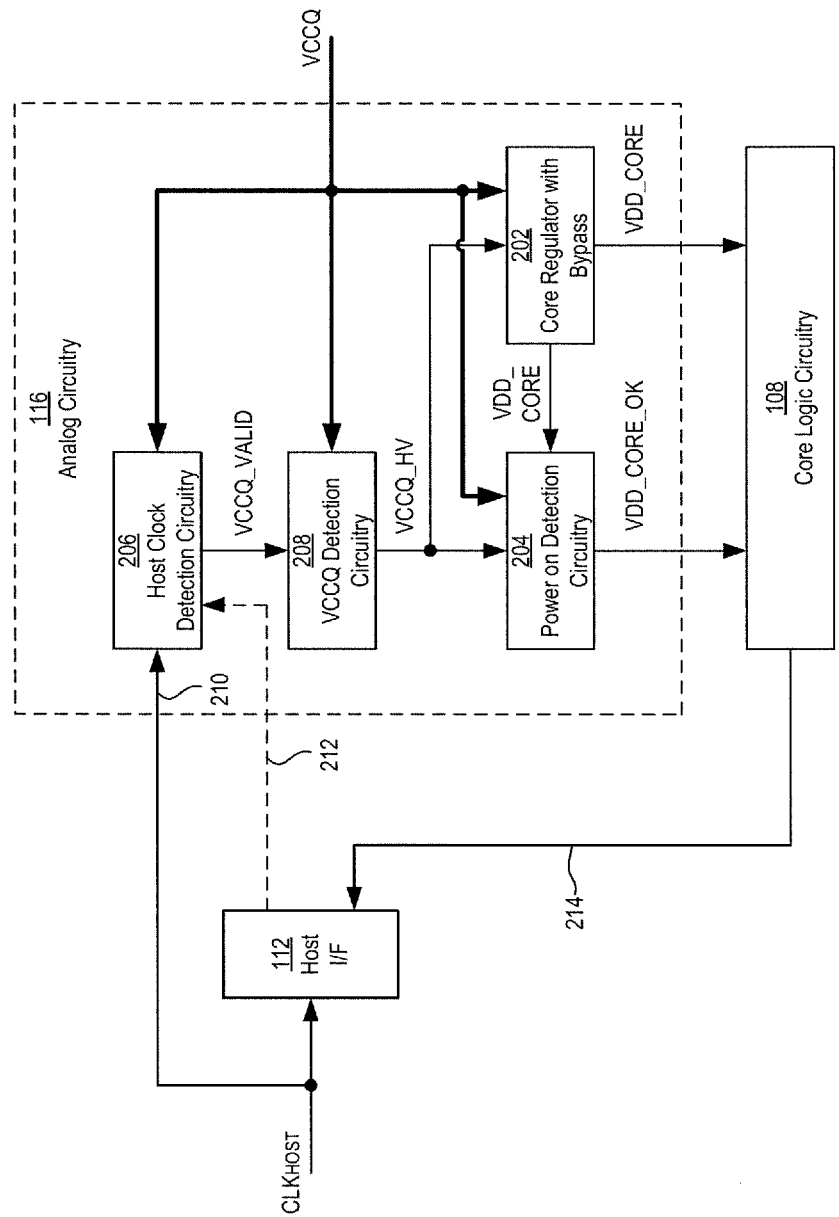
FIG. 2 is a block diagram of circuit components of analog circuitry of the eMMC system of FIG. 1 that may be used to provide a core supply voltage and a core voltage stabilization signal to core logic circuitry of the eMMC system.

FIG. 2 shows a block diagram of circuit components of the analog circuitry 116 that may be used to provide a core supply voltage VDD_CORE and a core voltage stabilization signal VDD_CORE_OK to the core logic circuitry 108. The core logic circuitry 108 may receive the core supply voltage VDD_CORE and the core voltage stabilization signal VDD_CORE_OK. The core logic circuitry 108 may be powered with the core supply voltage VDD_CORE in order to perform its memory management functions. Conversely, without being powered with the core supply voltage VDD_CORE, the core logic circuitry 108 may not be able to perform its memory management functions.

The core voltage stabilization signal may function as a reset signal that configures the core logic circuitry 108 in an active mode or a reset mode. In the active mode, the core logic circuitry 108 may be responsive to host commands. Alternatively, in the reset mode, the core logic circuitry 108 may be unresponsive to host commands. If the core voltage stabilization signal VDD_CORE_OK indicates that the core supply voltage VDD_CORE is stable, then the core logic circuitry 108 may be configured in the active mode and be responsive to host commands. Alternatively, if the core voltage stabilization signal VDD_CORE_OK indicates that the core supply voltage is not stable (or unstable), then the core logic circuitry 108 may be configured in the reset mode and be unresponsive to host commands.

The analog circuitry 116 may include a core regulator 202 that is configured to generate and provide the core supply voltage VCC_CORE to the core logic circuitry 108. The analog circuitry 116 may also include power on detection circuitry 204 that is configured to generate and provide the core voltage stabilization signal VDD_CORE_OK.

The analog circuitry 116 may further include additional circuitry that instructs or identifies to the core regulator 202 and the power on detection circuitry 204 when, at what level, and/or how to be configured in order for the core regulator 202 to generate and provide the core supply voltage VDD_CORE and for the power on detection circuitry 204 to generate and provide the core voltage stabilization signal VDD_CORE_OK. The additional circuitry may include host clock detection circuitry 206 that is configured to detect the presence or absence of the host clock signal on the host clock line $CLK_{HOST}$, which in turn may be an indication that the host system 102 has sent the host clock signal and/or that the host interface 112 has received the host clock signal from the host system 102. Additionally, the analog circuitry 116 may include VCCQ detection circuitry 208 configured to detect a level of the second supply voltage VCCQ. As shown in FIG. 2, each of the core regulator 202, the power on detection circuitry 204, the host clock detection circuitry 206, and the VCCQ detection circuitry 208 may be configured to receive the second supply voltage VCCQ to perform their respective functions.

During the power up process, the host system 102 may begin supplying the first and second supply voltages VCC, VCCQ to the eMMC system 104. Initially, the levels of the first and second supply voltages VCC, VCCQ may begin ramping up from 0 V (or some other initial voltage level). When the host system 102 detects that the second supply voltage VCCQ has reached or ramped up to a minimum level associated with the predetermined voltage level at which the second supply voltage VCCQ is to be supplied, the host system 102 may begin sending the host clock signal on the host clock line $CLK_{HOST}$ to the host interface 112. The host system 102 may then wait a predetermined time period while sending the host clock signal. Once the predetermined time period expires, the host system 102 may send to the eMMC system 104 an initial synchronization command CMD1 to start negotiating the operation voltage range at which the host system 102 and the eMMC system 104 are to communicate signals on the communications bus 114. The predetermined time period, otherwise referred to as a sequence length, is the longest of: one millisecond (1 ms), 74 clock cycles of the host clock signal, a supply ramp-up time, or a boot operation period during which the eMMC system 104 may be in the boot mode. Accordingly, the host system 102 may wait a minimum of 1 ms from the time it begins sending the host clock signal before sending the initial synchronization command CMD1.

Since the host system 102 may not begin sending the host clock signal until the second supply voltage VCCQ has reached the associated minimum level, then detection of the host clock signal may indicate that the minimum level has been reached, which in turn may indicate an appropriate time to detect the level of the second supply voltage VCCQ to determine whether to set the core regulator 202 in the regulation mode or the bypass mode. Otherwise stated, if presence of the host clock signal on the host clock line $CLK_{HOST}$ has not yet been detected, then the second supply voltage VCCQ may not yet have reached or ramped up its minimum level, which may indicate that it is too soon to detect the level of the second supply voltage VCCQ in order to determine whether to set the core regulator in the regulation mode or the bypass mode.

As shown in FIG. 2, in one example configuration, the host clock detection circuitry 206 may have an input 210 coupled to the host clock line $CLK_{HOST}$ to detect presence or absence of the host clock signal on the host clock line $CLK_{HOST}$. Other example configurations may be possible. For example, the host clock detection circuitry 206 may receive the host clock signal from the host interface 112, as denoted by dotted arrow 212, in order to perform the detection.

When the host clock detection circuitry 206 detects the host clock signal, the host clock detection circuitry 206 may notify the VCCQ detection circuitry 208 of the detection. The host clock detection circuitry 206 may do so by sending a notification signal VCCQ_VALID to the VCCQ detection circuitry 208, such as by transitioning a level of the notification signal VCCQ_VALID being output from a low level to a high level, or vice versa. The host clock detection circuitry 206 may include any of various circuit configurations to detect presence of the host clock signal on the host clock line CLK$_{HOST}$. In one example, the host clock detection circuitry 206 may include counter circuitry that detects clock cycles and counts the number of clock cycles it detects. When the number of clock cycles reaches a threshold number, the counter circuitry may determine that a host clock signal is present and send the notification signal VCCQ_VALID to the VCCQ detection circuitry 208. In another example, the host clock detection circuitry 206 may include edge detector circuitry configured to detect rising and/or falling edges in order to detect presence of the host clock signal. If a number of edges detected by the edge detector circuitry reaches a threshold number, then the edge detector circuitry may determine that a host clock signal is present and send the notification signal VCCQ_VALID to the VCCQ detection circuitry 208. Other circuit configurations for the host clock detection circuitry 206 may be possible.

In response to receipt of the notification signal VCCQ_VALID, the VCCQ detection circuitry 208 may determine to detect the level of the second supply voltage VCCQ and detect what that level is. Based on the detected level, the VCCQ detection circuitry 208 may determine whether to configure the core regulator 202 in the regulation mode or in the bypass mode. In particular, if the detected level of the second supply voltage VCCQ indicates that the voltage drop or difference between the level of the second supply voltage VCCQ and a target level of the core supply voltage VDD_CORE is sufficiently large enough for the core regulator 202 to properly function, then the VCCQ detection circuitry 208 may determine to configure the core regulator 202 in the regulation mode. Alternatively, if the detected level of the second supply voltage VCCQ indicates that the voltage drop or difference between the level of the second supply voltage VCCQ and the target level of the core supply voltage VDD_CORE is too small for the core regulator 202 to properly function, then the VCCQ detection circuitry 208 may determine to configure the core regulator 202 in the bypass mode. Based on the determination, the VCCQ detection circuitry 208 may output a control signal VCCQ_HV to the core regulator 202 that configures the core regulator 202 in either the regulation mode or the bypass mode.

As an illustration, in one example configuration, the target level of the core supply voltage VDD_CORE may be 1.2 V. For host configurations where the host system 102 sends the second supply voltage VCCQ at 1.8 V or greater, the voltage drop or difference may be large enough for the core regulator 202 to operate properly. As such, it may be desirable for the core regulator 202 to operate in the regulation mode and monitor the level of the core supply voltage VDD_CORE to maintain the level within a voltage range such that the core supply voltage VDD_CORE is a regulated voltage. Alternatively, voltage levels lower than 1.8 V may provide too small of a voltage drop for the core regulator 202 to properly function. As such, upon receipt of a second supply voltage VCCQ that is less than 1.8 V, the core regulator 202 may operate in the bypass mode in which the core regulator 202 directly sends the second supply voltage VCCQ to its output and outputs the second supply voltage VCCQ as the core supply voltage VDD_CORE without performing any regulation. That is, in the bypass mode, the core regulator 202 may not monitor the level of the core supply voltage VDD_CORE to maintain the level within the voltage range. In this way, in the bypass mode, the core supply voltage VDD_CORE being output (i.e., the second supply voltage VCCQ) is an unregulated voltage. Accordingly, during power up, if the VCCQ detection circuitry 208 detects the level of the second supply voltage VCCQ to be 1.8 V or greater, the VCCQ detection circuitry 208 may output the control signal VCCQ_HV at a level or in a way that configures the core regulator 202 in the regulation mode. Alternatively, if the VCCQ detection circuitry 208 detects the level of the second supply voltage VCCQ to be less than 1.8 V, the VCCQ detection circuitry 208 may output the control signal VCCQ-HV at a level or in a way that configures the core regulator 202 in the bypass mode.

In response to receipt of the control signal VCCQ_HV, the core regulator 202 may configure itself in either the regulation mode or in the bypass mode and begin supplying the core supply voltage VDD_CORE according to the mode in which it is configured. In the regulation mode, the core regulator 202 may employ feedback to monitor the level of the core supply voltage VDD_CORE in order to maintain the level of the core supply voltage VDD_CORE at a constant level and/or within a voltage range. In this way, the core regulator 202 supplies the core supply voltage VDD_CORE as a regulated voltage. In the bypass mode, feedback may not be employed such that the level of the core supply voltage VDD_CORE is not monitored to be maintained at a constant level and/or within a voltage range. In this way, the core regulator 202 supplies the core supply voltage VDD_CORE as an unregulated voltage. Also, in some example configurations, prior to receipt of the control signal VCCQ_HV, the output of the core regulator 202 may be in a high impedance or floating state.

In addition or alternatively, regulating the second supply voltage VCCQ to generate the core supply voltage VDD_CORE may include reducing a noise component of the second supply voltage VCCQ and/or generating the core supply voltage VDD_CORE to have a higher power supply rejection ratio (PSRR) than the second supply voltage VCCQ. The second supply voltage VCCQ may have an undesirably high noise component for various reasons, such as due to switching performed by switching regulators of the host system 102 to generate the second supply voltage VCCQ, high and low voltage level switching performed by the host interface circuitry 112, and/or changes in current draw on the communications bus 114 and/or on one or both of the supply lines 118, 120. Other reasons may be possible. Reducing the noise component of the second supply voltage VCCQ may improve or optimize performance of the core logic circuitry 108.

In addition, in some example configurations, regulating the second supply voltage VCCQ may include stepping-down the level of the second supply voltage VCCQ—i.e., the level of the core supply voltage VDD_CORE is lower than the level of the second supply voltage VCCQ. For example, if the level of the second supply voltage VCCQ is 1.8 V, and the target level of the core supply voltage VDD_CORE is 1.2 V, then regulating the second supply voltage VCCQ to generate the core supply voltage VDD_CORE may include stepping-down the level of the second supply voltage VCCQ from 1.8 V to 1.2 V.

Alternatively, if the core regulator 202 is configured in the bypass mode, then the core regulator 202 may send the second supply voltage VCCQ it is receiving at its input directly to its output without performing regulation. As such, in the bypass mode, the core regulator 202 does not monitor the level of the core supply voltage VDD_CORE to maintain the level at a constant level or within a voltage range, the noise component of the core supply voltage VDD_CORE is not reduced compared to the noise component of the second supply voltage VCCQ, and the level of the core supply voltage VDD_CORE is not stepped-down from the level of the second supply voltage VCCQ.

In addition to configuring the core regulator 202 in either the regulation mode or the bypass mode, the VCCQ detection circuitry 208 may instruct the power on detection circuitry 204 when to send the core voltage stabilization signal VDD_CORE_OK. The second supply voltage VCCQ reaching the associated minimum value may indicate that the second supply voltage VCCQ, and in turn the core supply voltage VDD_CORE, is at a stable level for the core logic circuitry to operate. Since the host system 102 sends the host clock signal once the second supply voltage VCCQ reaches the associated minimum level, then the time at which the host clock signal is communicated on the host clock line $CLK_{HOST}$ may be an appropriate time at which to notify the core logic circuitry 108 that the core supply voltage VDD_CORE is stable. As such, when the VCCQ detection circuitry 208 receives the notification signal VCCQ_VALID from the host clock detection circuitry 206 that the host clock signal is being communicated, the VCCQ detection circuitry 208 may enable the power on detection circuitry 204 to send the core voltage stabilization signal VDD_CORE_OK to the core logic circuitry 108.

In the example configuration shown in FIG. 2, the control signal VCCQ_HV used to configure the core regulator 202 in the regulator and bypass modes may also be used to enable the power on detection circuitry 204. As shown in FIG. 2, the core regulator 202 may also supply the core supply voltage VDD_CORE to the power on detection circuitry 204. When the power on detection circuitry 204 is enabled in response to receipt of the control signal VCCQ_HV, then when the power on detection circuitry 204 senses the core supply voltage VDD_CORE from the core regulator 202, the power on detection circuitry 204 may determine that it is time to notify the core logic circuitry 108 that the core supply voltage VDD_CORE is at a stable level. In turn, the power on detection circuitry 204 may send the core voltage stabilization signal VDD_CORE_OK to the core logic circuitry 108, such as by transitioning the level of the core voltage stabilization signal VDD_CORE_OK from a low level to a high level or vice versa. In response to receipt of the core voltage stabilization signal VDD_CORE_OK, the core logic circuitry 108 may accept and allow itself to be powered by the core supply voltage VDD_CORE.

After the core logic circuitry 108 powers up, the core logic circuitry 108 may notify the host interface 112 that the core logic circuitry 108 has powered up, such as by sending a notification signal or message to the host interface 112, as shown by the arrow 214 in FIG. 2. Upon receipt and/or detection of the notification, the host interface 112 may send a signal or message to the host system 102, such as by using the command line CMD and/or one more of the data lines DAT[7:0], to indicate that the core logic circuitry 108 is ready to communicate with the host system 102 and/or process host commands.

Figure 3:
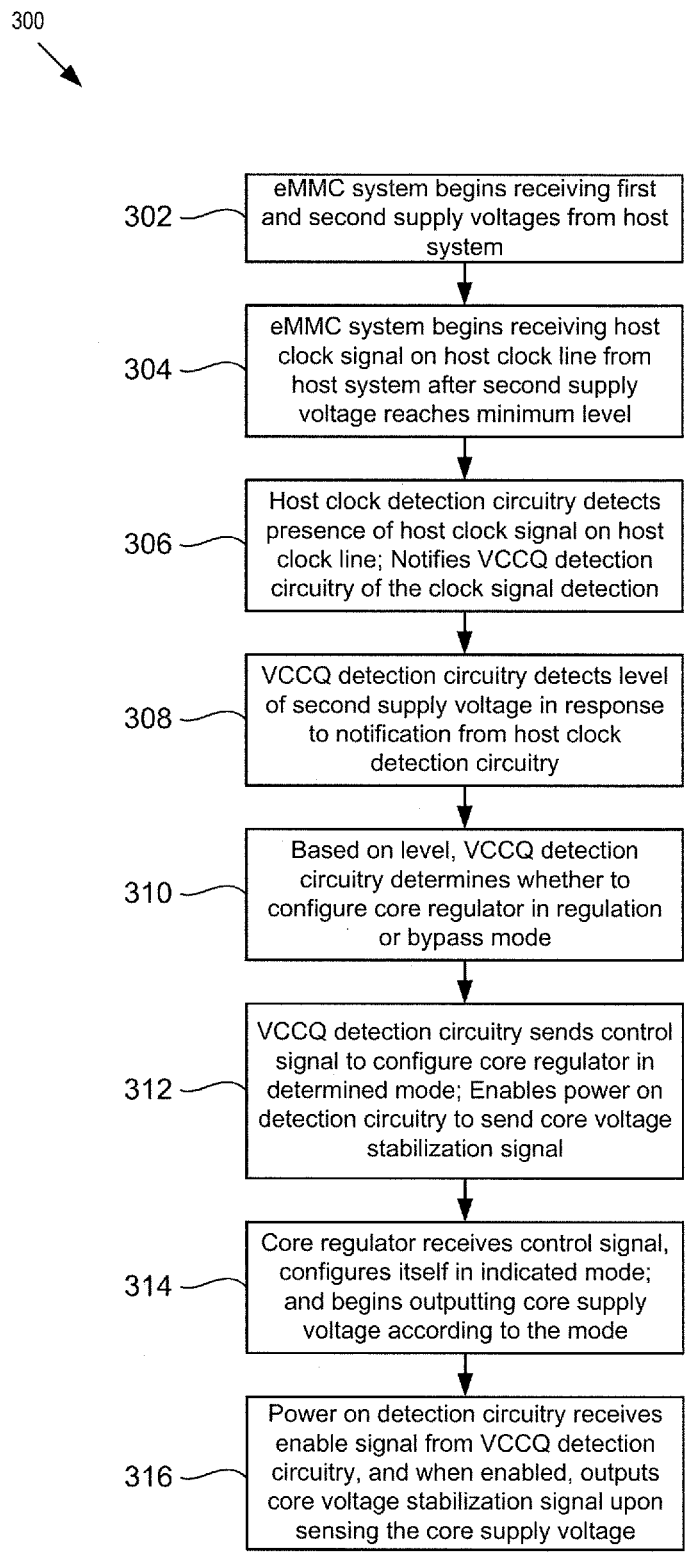
FIG. 3 is a flow chart of an example method of supplying a core supply voltage and a core voltage stabilization signal to core logic circuitry of an eMMC system.

FIG. 3 is a flow chart of an example method 300 of supplying a core supply voltage and a core voltage stabilization signal to core logic circuitry of an eMMC system. At block 302, the eMMC system may begin receiving a first supply voltage VCC and a second supply voltage VCCQ from a host system. At block 304, the eMMC system may begin receiving a host clock signal from the host system on a host clock line of a communications bus. The host clock signal may be received by at least a host interface of the eMMC system. As previously described, the host system may begin sending the host clock signal when it detects that the second supply voltage VCCQ has reached a minimum level associated with a predetermined voltage level at which the second supply voltage VCCQ is to be supplied.

At block 306, host clock detection circuitry of the eMMC system may detect presence of the host clock signal on the host clock line. In some example methods, the host clock detection circuitry may detect the presence of the clock signal by being directly coupled to the host clock line and receiving the host clock signal when it is present. In other example methods, the host clock detection circuitry may detect the presence of the clock signal by receipt of the host clock signal or some other signal indicative of receipt of the clock signal from the host interface. Additionally, at block 306, in response to detecting the presence of the host clock signal, the host clock detection circuitry may notify VCCQ detection circuitry of the detection of the host clock signal.

At block 308, the VCCQ detection circuitry may receive the notification from the host clock detection circuitry, and in response, determine to detect the level of the second supply voltage VCCQ it is receiving, and detect what that level is. At block 310, the VCCQ detection circuitry may determine whether to configure a core regulator in a regulation mode or in a bypass mode based on the detected level of the second supply voltage VCCQ. As previously described, if the level of the second supply voltage VCCQ is high enough such that a difference or voltage drop between the detected level and a target level of the core supply voltage is large enough for the core regulator to properly operate, then the VCCQ detection circuitry may determine to configure the core regulator in the regulation mode. Alternatively, if the level of the second supply voltage VCCQ is at a level such that the difference or voltage drop between the detected level and a target level of the core supply voltage is too small for the core regulator to properly operate, then the VCCQ detection circuitry may determine to configure the core regulator in the bypass mode.

At block 312, the VCCQ detection circuitry may send a control signal at a level or in a way that indicates the mode in which the regulator is to be configured according to the determination. Additionally, at block 312, the VCCQ detection circuitry may send an enable signal to power on detection circuitry that enables the power on detection circuitry to send the core voltage stabilization signal to the core logic circuitry.

At block 314, the core regulator may receive the control signal and in response, be configured in either the regulation mode or the bypass mode. In addition, at block 314, the core regulator may begin generating and supplying the core supply voltage in accordance with the mode in which it is configured. At block 316, the power on detection circuitry may receive the enable signal from the VCCQ detection circuitry and become enabled. Additionally, at block 316, when enabled and upon sensing the core supply voltage from the core regulator, the power on detection circuitry may output to the core voltage stabilization signal to the core logic circuitry to indicate that the core supply voltage is stable.

Referring back to FIG. 1, after the power up process and the device becomes initialized during the device identification and/or boot modes, the eMMC system 104 may enter into the data transfer mode, as previously described. When operating in the data transfer mode, the eMMC system 104 may be configured in a plurality of states involving the active transfer of data, including a transfer state, a bus-test state, a sending-data state, a receive-data state, and a programming state. In the data transfer mode, the eMMC system 104 may also be configured in a standby mode, in which the eMMC system 104 "stands by" or waits to be configured in one of the states involving the active transfer of data. Additionally, the eMMC system 104 may be configured in a sleep state, in which power consumption is minimized or at least lower than when operating in the other states while operating in the data transfer mode. When in the sleep state, the eMMC system 104 may be responsive to a limited number of commands sent by the host system 102, such as only a sleep/awake command CMD5 that transitions the eMMC system between the sleep state and the standby state, and a reset command CMD0 that resets the eMMC system 104. In addition, when the eMMC system 104 is in the sleep state, the eMMC 104 may receive the second supply voltage VCCQ but not the first supply voltage VCC from the host system 102, whereas in the other states, the eMMC system 104 may receive both the first supply voltage VCC and the second supply voltage VCCQ.

Figure 4:
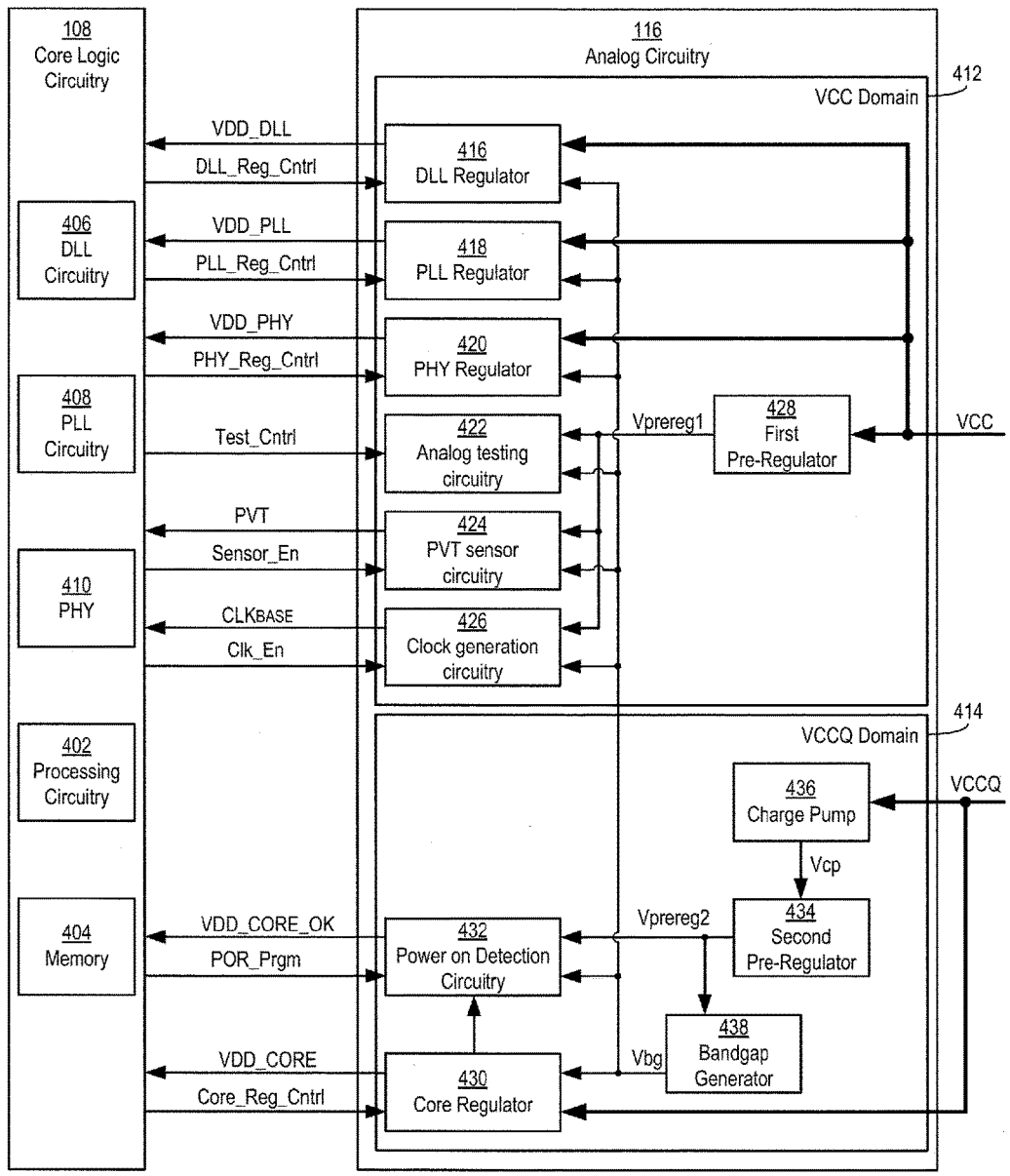
FIG. 4 is a block diagram of an example arrangement of various example circuit components of analog circuitry and circuit components of core logic circuitry of the eMMC system of FIG. 1.

FIG. 4 shows a block diagram of an example arrangement of various circuit components of the analog circuitry 116, as well as components of the core logic circuitry 108 in more detail. The core logic circuitry 108 may include processing circuitry 402, which may be configured to perform the memory management functions of the core logic circuitry 108. The processing circuitry 402 may include hardware or a combination of hardware and software. For example, the processing circuitry 402 may include a central processing unit, an application specific integrated circuit (ASIC), a field programmable gate array (FPGA), a digital logic circuit, an analog circuit, a combination of discrete circuits, gates, or any other type of hardware, or a combination thereof.

The core logic circuitry 108 may also include memory 404, which may include volatile memory (e.g., random access memory (RAM)), non-volatile memory (e.g., read-only memory (ROM)), or a combination thereof. The memory 404 may store software or firmware instructions and/or certain data structures, such as address translation data structures, that the processing circuitry 402 may access and/or and execute to perform at least some of its memory management functions. Additionally, the memory 404 may temporarily store data that is to be transferred to and stored in the non-volatile memory 106 such as in response to a host write command, and/or that was retrieved from the non-volatile memory 106 and is to be sent to the host system 102, such as in response to a host read command.

The core logic circuitry 108 may also include delay-locked loop (DLL) circuitry 406, phase-locked loop (PLL) circuitry 408, and a physical layer interface (PHY) 410. The DLL circuitry 406 may be used for clocking to transfer data between the non-volatile memory 106 and the memory interface 110. The PLL circuitry 408 may generate different clocks with different clock rates or frequencies for components of the processing circuitry 402 that operate in different clock domains. The physical layer interface 410 may provide an electrical interface between the host interface 112 (FIG. 1) and the processing circuitry 402.

In the example arrangement shown in FIG. 4, the circuit components of the analog circuitry 116 may be arranged or configured into one of a plurality of different supply voltage domains, including a first supply voltage VCC domain 412 and a second supply voltage VCCQ domain 414. The circuit components arranged in the first supply voltage domain 412 may be configured to receive and/or operate based on the first supply voltage VCC, and the circuit components arranged in the second supply voltage VCCQ domain 414 may be configured to receive and/or operate based on the second supply voltage VCCQ.

For the example arrangement shown in FIG. 4, whether a circuit component of the analog circuitry 116 is in the first supply voltage domain 412 or the second supply voltage domain 414 may depend on whether that circuit component operates or is powered on when the eMMC system 104 is in the sleep state. Those circuit components that do not operate and/or are not powered on during the sleep state may be configured in the first supply voltage domain 412, and those circuit components that do operate and/or are powered on during the sleep state may be configured in the second supply voltage domain 414.

In further detail, the first supply voltage domain 412 may include a DLL regulator 416, a PLL regulator 418, a PHY regulator 420, analog testing circuitry 422, PVT sensor circuitry 424, and clock generation (or oscillator) circuitry 426. The DLL regulator 416 may be configured to supply a DLL regulator supply voltage VDD_DLL to the DLL circuitry 406 to power the DLL circuitry 406. Similarly, the PLL regulator 418 may be configured to supply a PLL regulator supply voltage VDD_PLL to the PLL circuitry 408 to power the PLL circuitry 408, and the PHY regulator 420 may be configured to supply a PHY regulator supply voltage VDD_PHY to the physical interface circuitry 410 to power the physical interface circuitry 410. In the example configuration shown in FIG. 4, each of the regulators 416, 418, 420 may be configured to receive the first supply voltage VCC and generate their respective regulator supply voltages based on the first supply voltage VCC. Additionally, the core logic circuitry 108, such as by using the processing circuitry 402, may be configured to send control signals DLL_Reg_Cntrl, PLL_Reg_Cntrl, PHY_Reg_Cntrl to respective DLL, PLL, and PHY regulators 416, 418, 420 to enable and disable the respective DLL, PLL, and PHY regulators 416, 418, 420. When enabled, the PLL, DLL, and PHY regulators 406, 408, 410 may be able to supply their respective regulator supply voltages, and when disabled, the PLL, DLL, and PHY regulators 406, 408, 410 may be disabled and/or unable to supply their respective regulator supply voltages.

The analog testing circuitry 422 may be used for testing or debugging. The analog testing circuitry may include multiplexer (MUX) circuitry that may be configured and/or switched to a plurality of different states in order to test or debug other components of the analog circuitry 116. The core logic circuitry 108, such as by using the processing circuitry 402, may send a control signal Test_Cntrl to the analog testing circuitry 422 to configure the analog testing circuitry 422 in a desired one of its different states.

The PVT sensor circuitry 424 may include one or more sensors that sense one or more process, voltage, or temperature parameters during operation. The PVT sensor circuitry 424 may communicate PVT information to the core logic circuitry 108, such as to the processing circuitry 402 and/or the PLL circuitry 408, which in turn may use that information to optimize performance. For example, based on sensed temperature, voltage, and/or process information received from the PVT sensor circuitry 424, the processing circuitry 402 and/or the PLL circuitry 408 may determine to increase, decrease, or maintain the clock rates of one or more clock signals being generated and used for clocking in order to process data. The core logic circuitry 108, such as by using the processing circuitry 402, may send a sensor enable/disable signal Sensor_En to enable and disable the PVT sensor circuitry 424.

The clock generation or oscillator circuitry 426 may be configured to generate a base clock signal $CLK_{BASE}$, which may be supplied to and used by the processing circuitry 402, the DLL circuitry 406, and/or the PLL circuitry 408 in order for those circuities 402, 406, 408 to operate and perform their respective functions. The core logic circuitry 108, such as by using the processing circuitry 402, may send a clock enable/disable signal Clk_En to enable and disable the clock generation circuitry 426.

During the sleep state, the processing circuitry 402 may not operate or process data on any clock pulses and/or communicate data to the host system 102. As such, during the sleep state, the clock generation circuitry 426 may be disabled since the base clock signal $CLK_{BASE}$ that it generates may not be used by the core logic circuitry 108. Likewise, since clock signals generated by the DLL circuitry 406 and the PLL circuitry 408 may not be used during the sleep state, the DLL and PLL regulators 416, 418 may be disabled during the sleep state in order to power down the DLL and PLL circuitries 406, 408. Additionally, the physical interface 410 may not be in operation during the sleep state, and so the PHY regulator 420 may be disabled. Further, the analog testing circuitry 422 and the PVT sensor circuitry 424 may be used in conjunction with the core logic circuitry 108 when the core logic circuitry 108 is active and the processing circuitry 402 is operating on clock pulses, but may not be used when the core logic circuitry 108 is in the sleep state. Accordingly, during the sleep state, the analog testing circuitry 422 and the PVT sensor circuitry 424 may be disabled.

In addition, as shown in FIG. 4, the first supply voltage domain 412 may further include a first pre-regulator 428. As previously described, one function of a regulator when generating its regulated output voltage may be to decrease the noise component (or increase the power supply rejection ratio (PSRR)) of the input supply voltage it is receiving. Since the DLL, PLL, and PHY regulators 416, 418, 420 themselves perform regulation, a pre-regulator to reduce the noise component of the first supply voltage VCC may not be needed for those components of the first supply voltage domain 412. However, in order to maximize the performance of the other, non-regulator components of the first supply voltage domain 412 (i.e., the analog testing, PVT sensor, and clock generation circuitries 422, 424, 426), the first supply voltage VCC may first be regulated before it is supplied to those components. Accordingly, the first pre-regulator 428 may be configured in the first supply voltage domain 412 to receive the first supply voltage VCC, generate a first pre-regulated voltage Vprereg1 based on the first supply voltage VCC, and supply the first pre-regulated voltage Vprereg1 to each of the analog testing, PVT sensor, and clock generation circuitries 422, 424, 426.

The second supply voltage domain 414 may include a core regulator 430 and power on detection circuitry 432. The core regulator 430 and power on detection circuitry 432 of the example arrangement for the analog circuitry 116 shown and described with reference to FIG. 4 may be the same as or similar to the core regulator 202 and power on detection circuitry 204 shown and described with reference to FIG. 2. Referring particularly to the configuration in FIG. 4, the core regulator 430 may be configured to supply a core supply voltage VDD_CORE, which may be used to power all or at least some of the circuit components of the processing circuitry 402 and the memory 404. The core logic circuitry 108, such as by using the processing circuitry 402, may send a control signal Core_Reg_Cntrl to the core regulator 430 to enable and disable the core regulator 430. In addition, as previously described with reference to FIG. 2, the power on detection circuitry 432 may provide the processing circuitry 402 with a core voltage stabilization signal VDD_CORE_OK indicating that the level of the core supply voltage VDD_CORE is stable. The core logic circuitry 108, such as by using the processing circuitry 402, may send a control signal POR_Prgm to the power on detection circuitry 432 in order to calibrate the power on detection circuitry 432. In particular, depending on different circumstances, the predetermined level at which the core regulator 430 is to supply the core supply voltage VDD_CORE may be different at different periods of time in operation. To determine whether the level of the core supply voltage VDD_CORE is stable, the power on detection circuitry 432 may be configured to compare the level of the core supply voltage VDD_CORE with a reference level. The control signal POR_Prgm may be used to set the reference level in accordance with the predetermined level at which the core regulator 430 is to supply the core supply voltage VDD_CORE. For example, if circumstances change such that the core regulator 430 is to output the core supply voltage VDD_CORE at a higher level, then the control signal POR_Prgm may be adjusted to increase the reference level used by the power on detection circuitry 432.

During the sleep state, at least a portion of the processing circuitry 402 may remain active or powered on in order to be responsive to a sleep/awake command CMD5 received from the host system 102 that instructs the processing circuitry 402 to transition the eMMC system 104 from the sleep state to the standby state and/or a reset command CMD0 to reset the eMMC system 104. In order for the processing circuitry 402 to remain active, the core regulator 430 may remain active and provide the core supply voltage VDD_CORE to the core logic circuitry 108 in the sleep state. Additionally, since the core logic circuitry 108 may want to know that the core supply voltage VDD_CORE it is receiving while in the sleep state is stable, then the power on detection circuitry 418 may also remain active and provide the core voltage stabilization signal VDD_CORE_OK to the core logic circuitry 108 during the sleep state.

As shown in FIG. 4, the core regulator 430 may receive the second supply voltage VCCQ to generate the core supply voltage VDD_CORE. However, the second supply voltage VCCQ may be too noisy for optimal operation of the power on detection circuitry 432, and so rather than receive the second supply voltage VCCQ, the power on detection circuitry 432 may receive a regulated voltage Vprereg2 from a second pre-regulator 434 configured in the second supply voltage domain 414, which may be configured to generate the regulated voltage Vprereg2 based on the second supply voltage VCCQ.

As previously described, in order for a regulator to operate properly, the voltage drop or difference between the input voltage and the output voltage has to be sufficiently large. So that an eMMC system 104 having the example analog circuitry arrangement shown in FIG. 4 can be compatible with a host system 102 that sends the second supply voltage VCCQ at a level where the voltage drop between the second supply voltage VCCQ and the regulated voltage Vprereg2 is too small, the second supply voltage domain 414 may include a charge pump 436 configured to increase the level of the second supply voltage VCCQ to provide a sufficiently large voltage drop. In particular, the charge pump 436 may receive the second supply voltage VCCQ and generate a charge pump voltage Vcp based on the second supply voltage VCCQ. For some example configurations, the charge pump 436 may be configured to generate the charge pump voltage Vcp at a level that is about one and one-half (1.5) times the level of the second supply voltage VCCQ, although other configurations are possible. The charge pump 436 may supply the charge pump voltage Vcp to the second pre-regulator 434, and the second pre-regulator 434 may generate the regulated voltage Vprereg2 based on the charge pump voltage Vcp.

Additionally, the analog circuit components in the both the first and second supply voltage domains 412, 414 may use a reference voltage to perform their respective functions. In the example arrangement shown in FIG. 4, a bandgap generator 438 may be included in the second supply voltage domain 414 and configured to generate and supply a reference voltage Vbg to each of the DLL regulator 416, the PLL regulator 418, the PHY regulator 420, the analog testing circuitry 422, the PVT sensor circuitry 424, the clock generation circuitry 426, the core regulator 430, and the power on detection circuitry 432. The bandgap regulator 434 may be configured in the second supply voltage domain 414 rather than in the first supply voltage domain 412 since the core regulator 430 and the power on detection circuitry 432 may remain active and operational in the sleep state. As shown in FIG. 2, the bandgap generator 438 may receive the regulated voltage Vprereg2 from the second pre-regulator 434, and generate the reference voltage Vbg based on the regulated voltage Vprereg2.

Various example arrangements that partition analog circuit components of the analog circuitry 116 into multiple, different supply voltage domains other than the example arrangement shown in FIG. 4 may be possible. In general, the second supply voltage domain VCCQ 414 may include at least the core regulator 414 that is configured to keep the portion of the core logic circuitry 108 active or powered on during the sleep state in order for that portion to be responsive to host commands that the host system 102 may send when the eMMC system 104 is in the sleep state. In addition, in general, the first supply voltage domain 412 may include at least one analog circuit component that is not needed to be operational during the sleep state.

In alternative example arrangements, all of the circuit components of the analog circuitry 116 may be included in a single supply voltage domain, such as the second supply voltage VCCQ domain 414. The multiple domain arrangement of the analog circuitry 116 shown in FIG. 4, compared to a single domain arrangement, may provide a more robust solution for performance, specifically in terms of power supply rejection ratio (PSRR). For example, as mentioned, the host system 102 (FIG. 1) may be configured to supply each of the first supply voltage VCC and the second supply voltage VCCQ at levels corresponding to one of a plurality of predetermined voltage levels, such as 3.3, 1.8, and 1.2 V. These levels may be different for different host system configurations and/or the different modes of operation. For the single domain arrangement, where the DLL regulator 416, the PLL regulator 418, and/or the PHY regulator 420 are configured in the VCCQ domain 414, if the second supply voltage VCCQ is supplied at a lower of the possible voltage levels (e.g., 1.2 V) the DLL, PLL, and PHY regulators 416, 418, 420 may be configured in the bypass mode and their respective outputs would not be regulated. Additionally, the analog testing, PVT sensor, and clock generation circuitries 422, 424, 426 may be operating without receiving the first pre-regulated voltage Vprereg1 from the first pre-regulator 428. Instead, they may be receiving the second supply voltage VCCQ to operate, resulting in degraded performance of those circuitries. By separating the circuit components of the analog circuitry 116 into two supply voltage domains, where the DLL, PLL, and PHY regulators 416, 418, 420, and the analog testing, PVT sensor, and clock generation circuitries 422, 424, 426 are configured in the first supply voltage VCC domain 412 rather than in the second supply voltage VCCQ domain 414, a more robust analog IP solution may be achieved for supporting the various voltage levels (e.g., 1.2 V, 1.8 V, and 3.3 V) of the first and second supply voltages VCC and VCCQ. In addition, the configuration shown in FIG. 4 does not require any external discrete components and has minimal impact on die size and standby current. Other or additional advantages or benefits of the example multiple domain arrangement shown in FIG. 4 may be possible.

Figure 5:
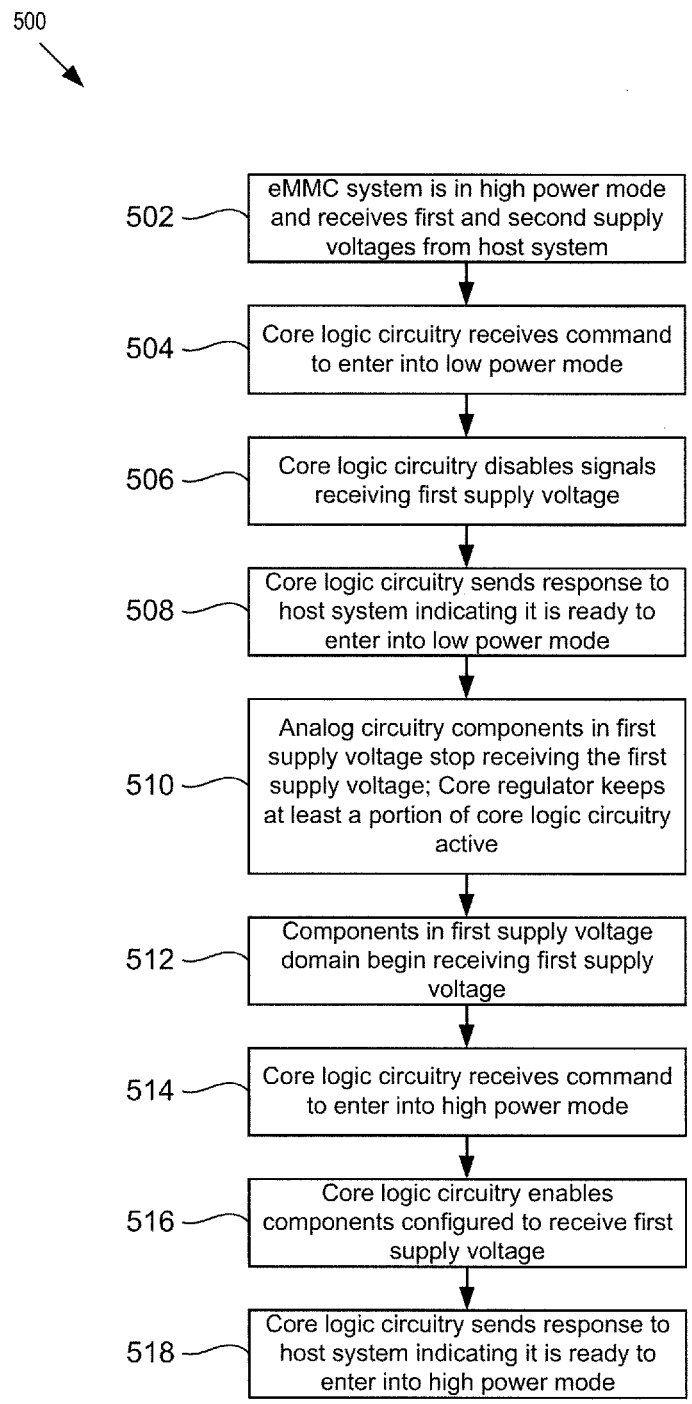
FIG. 5 is a flow chart of an example method of configuring components of analog circuitry of an eMMC system in a high power mode and a low power mode.

FIG. 5 shows a flow chart of an example method 500 of configuring components of analog circuitry of an eMMC system in a high power mode and a low power mode. The high power mode may be a power consumption mode associated with the eMMC system being in a standby state or a state in which the eMMC system is actively transferring data, and the low power mode may be a power consumption mode associated with the eMMC system being in a sleep state. In addition or alternatively, the high power mode may be a power consumption mode in which the eMMC system receives more supply voltages from a host system than when in the low power mode. For example, in the high power mode, the eMMC system may receive two supply voltages from the host system, and in the low power mode, the eMMC system may receive one supply voltage from the host system.

At block 502, the eMMC system may be configured in the high power mode and receive a first supply voltage and a second supply voltage from the host system. The first supply voltage may be supplied to components of the analog circuitry that do not operate in the low power mode. Example components of the analog circuitry that receive the first supply voltage may include one or more of a PLL regulator, a DLL regulator, a PHY regulator, analog testing circuitry, PVT sensor circuitry, and clock generation circuitry. Example components of the analog circuitry that receive the second supply voltage may include one or more of a core regulator and power on detection circuitry.

The core regulator may generate a core supply voltage and supply the core supply voltage to core logic circuitry. In some example methods, the core regulator may generate the core supply voltage based on the second supply voltage and a reference voltage. The reference voltage may be generated and supplied by a bandgap generator. To generate the reference voltage, a charge pump may receive the second supply voltage and generate a charge pump voltage based on the second supply voltage. The charge pump may supply the charge pump voltage to a pre-regulator, which may generate a regulated voltage based on the charge pump voltage. The pre-regulator may supply the regulated voltage to a bandgap generator, which may use the regulated voltage to generate the reference voltage.

At block 504, processing circuitry of the core logic circuitry of the eMMC system may receive a command to enter into the low power mode. In some example methods, the command may be a sleep/awake command that instructs the processing circuitry to transition the eMMC system from being in a standby state to a sleep state. At block 506, in response to receiving the command, the processing circuitry may send one or more disable signals to the circuit components receiving the first supply voltage. In response to receiving the disable signals, the components receiving the first supply voltage may become disabled and no longer perform their respective functions. In addition, at block 506, the processing circuitry may not send any disable signals to the components receiving the second supply voltage. Accordingly, the components receiving the second supply voltage may remain enabled or active when the processing circuitry receives the command to enter into the low power mode.

At block 508, after disabling the components receiving the first supply voltage, the processing circuitry may send a response back to the host system indicating that the eMMC system is ready to enter into the low power mode. At block 510, after sending the response to the host system, the components configured to receive the first supply voltage may stop receiving the first supply voltage from the host system, while the components configured to receive the second supply voltage may continue receiving the second supply voltage from the host system. By continuing to receive second supply voltage, the core regulator may continue to supply a core supply voltage to at least a portion of the processing circuitry configured to detect receipt of another command from the host system that instructs the eMMC system to enter into the high power mode. Additionally, by continuing to receive the second supply voltage, the power on detection circuitry may continue to operate to notify the processing circuitry that the core supply voltage is stable.

At block 512, the host system may determine that it wants the eMMC system to enter into the high power mode and begin sending the first supply voltage to the eMMC system. Accordingly, at block 512, the components of the eMMC system configured to receive the first supply voltage may begin receiving the first supply voltage. The components configured to receive the second supply voltage may continue receiving the second supply voltage from the host system.

At block 514, the processing circuitry may receive a command to enter into the high power mode. In some example methods, the command may be a sleep/awake command that instructs the processing circuitry to transition the eMMC system from being in the sleep state to the standby state. At block 516, in response to receiving the command, the processing circuitry may send one or more enable signals to the circuit components configured to receive the first supply voltage. In response to receiving the enable signals, the components receiving the first supply voltage may become enabled to perform their respective functions. In addition, at block 514, the processing circuitry may not send any enable signals to the components receiving the second supply voltage since those components are already enabled. Accordingly, the components receiving the second supply voltage may remain enabled or active when the processing circuitry receives the command to enter into the high power mode.

At block 518, after enabling the components receiving the first supply voltage, the processing circuitry may send a response back to the host system indicating that the eMMC system has entered into the high power mode. The response may may be an indication to the host system that the eMMC system is ready to perform activities in the high power mode, such as high power data transfer.

In the example method 500, the eMMC system transitions from the high power mode to the low power mode, and then back to the high power mode. In other example methods, the eMMC system may transition from the low power mode to the high power mode and then back to the low power mode; only from the high power mode to the low power mode; only from the low power mode to the high power mode; or, in general, transition from the low power mode to the high power mode or vice versa any number of times by performing some or all of the operations described in FIG. 5.

Additionally, the circuit configuration of the analog circuitry 116 shown in FIG. 2 and the circuit configuration of the analog circuitry 116 shown in FIG. 4 may or may not be implemented together. For configurations where they are implemented together, the host clock detection circuitry 206 and the VCCQ detection circuitry 208 may be configured in the second supply voltage domain 414.

In addition or alternatively, the host clock detection circuitry 206 and the VCCQ detection circuitry 208 may be configured with analog circuitry arrangements or configurations of an eMMC system 104 than the one shown in FIG. 4, including configurations in which the analog circuitry components are not divided into different supply voltage domains, but rather in which they all receive the same supply voltage, such as the second supply voltage VCCQ.

Figure 6:
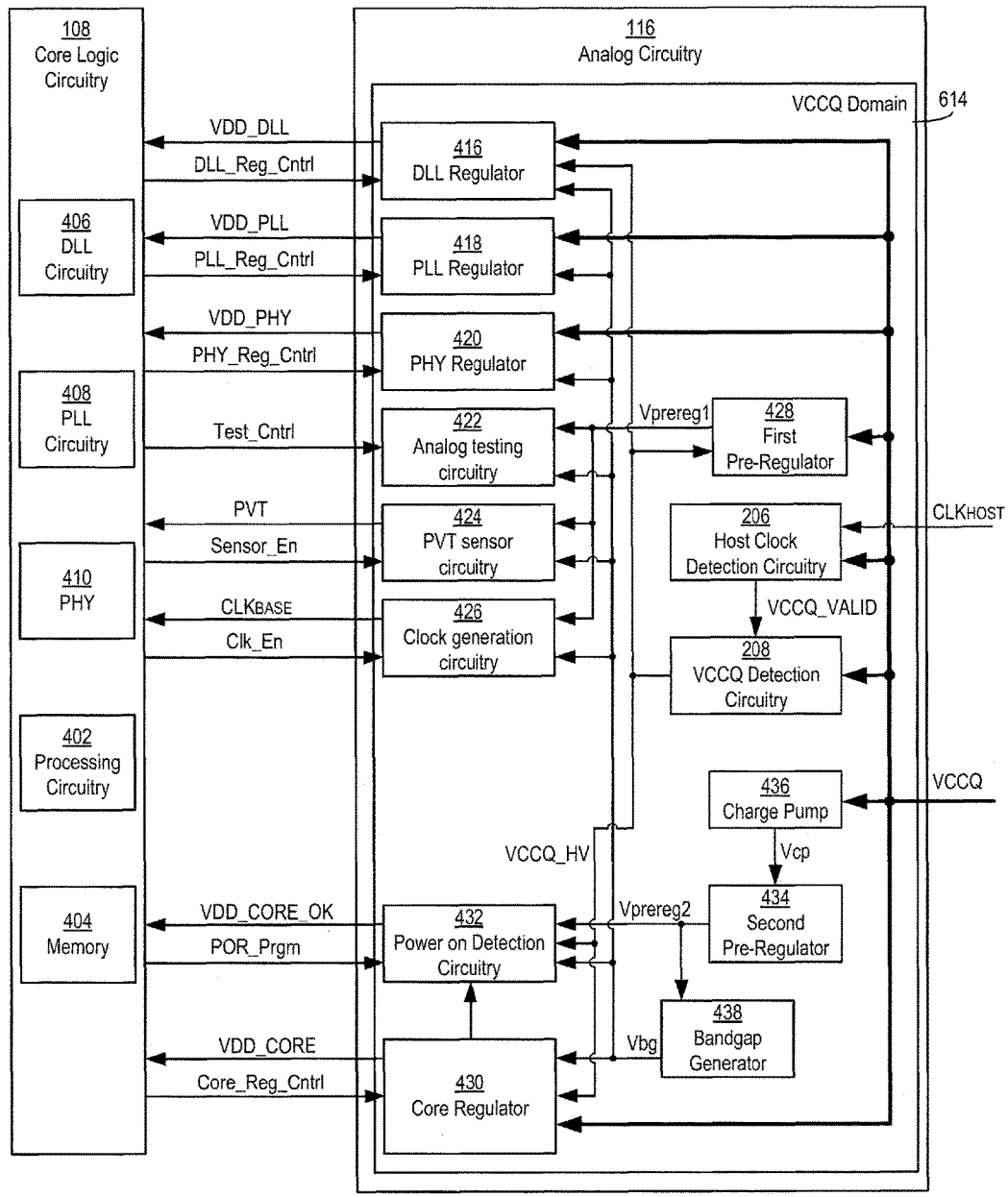
FIG. 6 is a block diagram of an example arrangement in which the circuit components of analog circuitry are included in a single supply voltage domain.

FIG. 6 shows a block diagram of another example arrangement in which all of the circuit components of the analog circuitry 116 (or at least those included in the arrangement shown in FIG. 4) are included in a single supply voltage VCCQ domain 614. Also shown as being included in the VCCQ domain 614 are the host clock detection circuitry 206 and the VCCQ detection circuitry 208. The host clock detection circuitry 206 and the VCCQ detection circuitry 208 may be configured to operate in the same way as previously described with reference to FIG. 2. For the arrangement shown in FIG. 6, in addition to sending the control signal VCCQ_HV to the core regulator 430 and the power on detection circuitry 432, the VCCQ detection circuitry 208 may also send the control signal VCCQ_HV to each of the DLL regulator 416, the PLL regulator 418, the PHY regulator 420, and the first pre-regulator 428, each of which may also be configured to operate in a regulation mode and a bypass mode. As previously described with respect to FIG. 2, based on the level of the second supply voltage VCCQ detected by the VCCQ detection circuitry 208, the VCCQ detection circuitry 208 may output the control signal VCCQ_HV to set each of the regulators 416, 418, 420, 428, 430 in either the regulation more or in the bypass mode. Other ways in which the host clock detection circuitry 206 and the VCCQ detection circuitry 208 may be implemented with analog circuitry 116 in order to set one or more regulators of the analog circuitry 116 in either the regulation mode or the bypass mode based on the host clock signal may be possible.

In addition, although the above eMMC system configurations and methods are described with reference to an eMMC system configured to communicate in accordance with a JEDEC eMMC Standard, similar configurations and methods may also be implemented with non-volatile memory systems other than eMMC systems, including removable, solid state drive, card-based, or other embedded memory systems. Additionally, similar configurations and methods may be implemented with electronic systems, devices, or apparatuses other than non-volatile memory systems, including those that may communicate with a host system/device, receive power supply voltages and a host clock signal from the host system/device.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

We claim:

1. An apparatus comprising:
   core logic circuitry;
   host interface circuitry configured to:
      receive a host clock signal on a host clock line during a predetermined time period; and
      receive a synchronization command upon expiration of the predetermined time period;
   host clock detection circuitry configured to detect the host clock signal within the predetermined time period;
   a core regulator configured to receive a supply voltage, and supply a core supply voltage based on the supply voltage to the core logic circuitry, wherein the core regulator is configured to supply the core supply voltage as a regulated voltage or an unregulated voltage based on the detection of the host clock signal; and
   host supply voltage level detection circuitry configured to:
      in response to detection of the host clock signal within the predetermined time period:
         detect a level of the supply voltage;
         configure the core regulator to supply the core supply voltage as either the regulated voltage or the unregulated voltage based on the detected level of the supply voltage; and
         instruct power on detection circuitry to output, to the core logic circuitry, a core voltage stabilization signal indicating that the core supply voltage is stable.

2. The apparatus of claim 1, wherein the host clock detection circuitry is further configured to:
   send a notification to the host supply voltage level detection circuitry in response to the detection of the host clock signal, and
   wherein the host supply voltage level detection circuitry is configured to:
      detect the level of the supply voltage in response to receipt of the notification.

3. The apparatus of claim 2, wherein the host supply voltage level detection circuitry is configured to generate a control signal that configures the core regulator to supply the core supply voltage as the regulated voltage, and send the control signal to the core regulator.

4. The apparatus of claim 3, wherein the host supply voltage level detection circuitry is further configured to:
   when the detected level of the supply voltage corresponds to a first predetermined voltage level, generate and output the control signal so that the core regulator is configured to output the core supply voltage as the regulated voltage; and
   when the detected level of the supply voltage corresponds to a second predetermined voltage level, generate and output the control signal so that the core regulator is configured to output the core supply voltage as the unregulated voltage.

5. The apparatus of claim 4, wherein the first predetermined voltage level is higher than the second predetermined voltage level.

6. The apparatus of claim 4, wherein a difference between the first predetermined voltage level and a target level of the core supply voltage is above a threshold difference level, and wherein a difference between the second predetermined voltage level and the target level of the core supply voltage is below a threshold difference level.

7. The apparatus of claim 1, wherein an output of the core regulator is in a floating or high impedance state prior to being configured to supply the core supply voltage as the regulated voltage or the unregulated voltage.

8. The apparatus of claim 1, further comprising at least one second regulator configured to supply at least one second supply voltage to at least one of: delay locked loop circuitry, phase locked loop circuitry, or a physical layer interface of the core logic circuitry, wherein the at least one second regulator is configured to supply the at least one second supply voltage as either a regulated voltage or an unregulated voltage to the core logic circuitry based on the detection of the host clock signal.

9. A method comprising:
   receiving, with a core regulator, a host supply voltage from a host system;
   receiving, with host interface circuitry, a host clock signal on a host clock line during a predetermined time period;
   receiving, with the host interface circuitry, a synchronization command from the host system upon expiration of the predetermined time period;
   detecting, with host clock detection circuitry, a presence of the host clock signal on the host clock line during the predetermined time period;
   in response to detecting the presence of the host clock signal during the predetermined time period:
      detecting, with host supply voltage detection circuitry, a level of the host supply voltage;
      supplying, with the core regulator, a core supply voltage as a regulated voltage or an unregulated voltage to core logic circuitry based on detecting the level of the host supply voltage; and
      sending, with power on detection circuitry, a core voltage stabilization signal to the core logic, the core voltage stabilization signal indicating that the core supply voltage is stable.

10. The method of claim 9, further comprising:
    receiving, with host supply voltage detection circuitry, a notification from the host clock detection circuitry that the presence of the host clock signal has been detected;
    in response to receiving the notification, detecting, with the host supply detection circuitry, a level of the host supply voltage; and
    configuring, with the host supply detection circuitry, the core regulator to supply the core supply voltage as either the regulated voltage or the unregulated voltage based on detecting the level of the host supply voltage.

11. The method of claim 10, wherein configuring the core regulator to supply the core supply voltage as either the regulated voltage or the unregulated voltage comprises:
    generating, with the host supply voltage detection circuitry, a control signal to configure the core regulator to supply the core supply voltage as the regulated voltage or the unregulated voltage, wherein whether the host supply voltage detection circuitry generates the control signal to configure the core regulator to supply the core supply voltage as the regulated voltage or the unregulated voltage is based on the detected level of the host supply voltage; and
    sending, with the host supply voltage detection circuitry, the control signal to the core regulator.

12. The method of claim 11, wherein generating the control signal comprises:
    when the detected level of the host supply voltage corresponds to a first predetermined voltage level, generating and outputting the control signal so that the core regulator outputs the core supply voltage as the regulated voltage; and
    when the detected level of the host supply voltage corresponds to a second predetermined voltage level, generating and outputting the control signal so that the core regulator outputs the core supply voltage as the unregulated voltage.

13. The method of claim 12, wherein a difference between the first predetermined voltage level and a target level of the core supply voltage is above a threshold difference level, and wherein a difference between the second predetermined voltage level and the target level of the core supply voltage is below a threshold difference level.

14. An apparatus comprising:
host interface circuitry configured to:
    receive a host clock signal on a host clock line during a predetermined time period;
    receive a synchronization command from a host system upon expiration of the predetermined period;
host clock detection circuitry configured to:
    detect a presence of the host clock signal on the host clock line within the predetermined time period;
    send a notification indicating that the presence of the host clock signal has been detected;
host supply voltage detection circuitry configured to:
    receive the notification from the host clock detection circuitry that the presence of the host clock signal has been detected;
    determine to detect a level of a host supply voltage in response to receipt of the notification that the host clock signal has been detected;
    detect the level of a host supply voltage in response the determination; and
    in response to the detected level, output a control signal indicating whether a core supply voltage is to be output as either a regulated voltage or an unregulated voltage; and
a core regulator configured to:
    receive the control signal from the host supply voltage detection circuitry; and
    supply the core supply voltage as the regulated voltage or the unregulated voltage to core logic circuitry in response to receipt of the control signal,
    wherein the core regulator is configured to monitor the core supply voltage using feedback in order to supply the core supply voltage as the regulated voltage, and
    wherein the core regulator is configured to bypass the supply voltage directly to an output of the core regulator in order to output the core supply voltage as the unregulated voltage; and
power on detection circuitry configured to:
    receive the control signal; and
    in response to receipt of the control signal, send a notification to the core logic circuitry indicating that the level of the host supply voltage is stable.

15. The apparatus of claim 1, wherein the core regulator is configured to monitor the core supply voltage using feedback in order to supply the core supply voltage as the regulated voltage, and
    wherein the core regulator is configured to bypass the supply voltage directly to an output of the core regulator to in order to output the core supply voltage as the unregulated voltage.

* * * * *